US011193998B2

(12) United States Patent
Niemann et al.

(10) Patent No.: US 11,193,998 B2
(45) Date of Patent: Dec. 7, 2021

(54) PERMANENT MAGNET ARRANGEMENT FOR GENERATING A HOMOGENEOUS FIELD ("3D HALBACH")

(71) Applicant: Bruker BioSpin GmbH, Rheinstetten (DE)

(72) Inventors: Volker Niemann, Ispringen (DE); Rainer Pietig, Malsch (DE)

(73) Assignee: BROKER BIOSPIN GMBH, Rheinstetten (DE)

( * ) Notice: Subject to any disclaimer, the term of this patent is extended or adjusted under 35 U.S.C. 154(b) by 161 days.

(21) Appl. No.: 16/547,769

(22) Filed: Aug. 22, 2019

(65) Prior Publication Data

US 2020/0064424 A1 Feb. 27, 2020

(30) Foreign Application Priority Data

Aug. 22, 2018 (DE) ..................... 10 2018 214 213.0

(51) Int. Cl.

| | |
|---|---|
| ***G01R 33/383*** | (2006.01) |
| ***H01F 7/02*** | (2006.01) |
| ***G01R 33/3873*** | (2006.01) |
| ***G01R 33/38*** | (2006.01) |

(52) U.S. Cl.
CPC ....... *G01R 33/383* (2013.01); *G01R 33/3802* (2013.01); *G01R 33/3873* (2013.01); *H01F 7/0278* (2013.01)

(58) Field of Classification Search
CPC .............. G01R 33/383; G01R 33/3873; G01R 33/3802; H01F 7/0278
See application file for complete search history.

(56) References Cited

U.S. PATENT DOCUMENTS

| | | | |
|---|---|---|---|
| 4,837,542 A | 6/1989 | Leupold | |
| 10,018,694 B2 | 7/2018 | Vidarsson | |
| 2005/0162250 A1* | 7/2005 | Higuchi | G01R 33/383 335/306 |

(Continued)

FOREIGN PATENT DOCUMENTS

| | | |
|---|---|---|
| JP | 2006294851 A | 10/2006 |

*Primary Examiner* — Susan S Lee

(74) *Attorney, Agent, or Firm* — Edell, Shapiro & Finnan LLC

(57) ABSTRACT

A magnet arrangement (1) in a magnetic resonance apparatus having a permanent magnet system for generating a homogeneous magnetic field in a direction perpendicular to a z-axis in a measurement volume. The magnet system has at least two ring-shaped magnet elements (2) in a ring plane, which are arranged coaxially around the z-axis and are constructed from individual magnet segments (3) arranged next to one another in a Halbach configuration. The magnetization direction of at least two ring-shaped magnet elements deviates from the ring plane such that the component perpendicular to the ring plane varies cosinusoidally with the azimuthal angle of the respective ring-shaped magnet element. The magnetization of in each case two ring-shaped magnet elements is mirror-symmetrical with respect to one another, wherein the mirror plane is the central x-y-plane perpendicular to the z-axis. The disclosed arrangement provides a compact and lightweight permanent magnet arrangement for an MR apparatus.

19 Claims, 5 Drawing Sheets

1 3 3 2 z y x 2' 3

(56) References Cited

U.S. PATENT DOCUMENTS

| | | | | |
|---|---|---|---|---|
| 2009/0289632 | A1* | 11/2009 | Bluemler | H01F 7/0284 324/309 |
| 2010/0013473 | A1 | 1/2010 | Blumich et al. | |
| 2015/0061680 | A1 | 3/2015 | Leskowitz | |

* cited by examiner

PERMANENT MAGNET ARRANGEMENT FOR GENERATING A HOMOGENEOUS FIELD ("3D HALBACH")

CROSS REFERENCE TO RELATED APPLICATIONS

This application claims foreign priority under 35 U.S.C. § 119(a)-(d) to German Application No. 10 2018 214 213.0 filed on Aug. 22, 2018, the entire contents of which are hereby incorporated into the present application by reference.

FIELD OF THE INVENTION

The invention relates to a magnet arrangement in a magnetic resonance apparatus having a permanent magnet system for generating a homogeneous magnetic field in a direction perpendicular to a z-axis in a measurement volume, wherein the permanent magnet system comprises at least two ring-shaped magnet elements containing magnetic material in a ring plane, which are arranged coaxially around the z-axis and are constructed from individual magnet segments arranged in a Halbach configuration, wherein the magnetization direction of at least two ring-shaped magnet elements deviates from the ring plane in such a way that the component perpendicular to the ring plane varies with the azimuthal angle of the ring, and a 3D angle $\alpha$ determines the deviation of the magnetization directions from those of a planar Halbach ring, and wherein the magnetization of in each case two ring-shaped magnet elements is mirror-symmetrical with respect to one another, and the mirror plane is the central x-y-plane perpendicular to the z-axis.

BACKGROUND

Such a magnet arrangement is known from U.S. Pat. No. 10,018,694 B2 (=reference [1]).

The present invention relates generally to the field of magnet construction, in particular the production and operation of magnet arrangements. The invention, however, also relates to the field of magnetic resonance (MR), in particular to providing permanent magnet systems which are suitable therefor and which are intended for generating homogeneous magnetic fields for NMR measurements. However, the applicability of the invention is not restricted to these fields.

Both in the field of nuclear magnetic resonance (NMR) spectroscopy and in the imaging application (MRI), a very homogeneous magnetic field that is constant over time is required in a sample volume to be defined, which magnetic field can be generated by resistive or superconducting coils or a suitable permanent magnet arrangement. The use of permanent magnets is preferred if flux densities of less than 2 T are sufficient and a comparatively compact construction is desired.

Benchtop NMR apparatuses require an extremely homogeneous magnetic field, which can be generated for instance by a superconducting magnet coil arrangement, but also by a permanent magnet arrangement.

The Halbach design is a known arrangement that can be used for this purpose. The use of ring-shaped permanent magnets having a magnetization as a Halbach dipole is described in the prior art (see, for instance, reference [2]).

In theory, the high field homogeneity required for NMR measurements can also be achieved using these magnet arrangements, but, precisely in the case of magnet rings in a Halbach configuration, it is very difficult to generate such a homogeneous B0 field. Ring-shaped Halbach dipoles are typically constructed in such a way that individual magnet segments having varying magnetization directions are joined together, the magnetization direction varying in azimuthal angle.

In order to achieve the field homogeneity demanded for NMR measurements in the sample volume, in the case of the yoke-free Halbach magnets, correction mechanisms must be provided in order to be able to compensate for tolerances of the magnet material or of the position of the individual magnet blocks, which complicates the mechanical construction. Yoke-based magnets generally have a parallel pole shoe pair composed of a soft-magnetic material having a correspondingly high saturation flux density. Through a suitable choice of the pole shoe geometry and specific surface processing, the field profile can be optimized in a comparatively simple and efficient manner.

The main causes which obstruct field homogeneity can be summarized as follows:

1. Finiteness of the arrangement in an axial direction, that is to say fundamental deviation from a cylinder extended infinitely in an axial direction.
2. Discretization of the magnetization direction along the cylinder circumference, that is to say fundamental deviation from the magnetization direction varying continuously with the azimuthal angle.
3. Additional disturbances resulting from mechanical tolerances for size, positioning and magnetic moment of the magnet segments.

SPECIFIC PRIOR ART

U.S. Pat. No. 4,837,542 A (=reference [3]) discloses a spherical permanent magnet constructed from individual segments, wherein the segments are tapered in a wedge-shaped fashion towards the midpoint and become smaller towards the pole regions (sphere segments). The construction of such a Halbach sphere is very complex; a construction composed of planar rings having geometrically identical segments is not disclosed. The magnetization direction of the individual segments in a revolution around the sphere is in a traditional Halbach configuration ($\alpha=2\theta$). The central hole of the magnet extends longitudinally along the polar axis in the direction of the B0 field. In the case of planar Halbach magnets constructed from segmented rings, the hole extends transversely, that is to say perpendicularly to the direction of the central field. In the case of a longitudinal hole, the B0 field is lower and thus less effective. Moreover, the basic magnet according to reference [3] generally generates an inhomogeneous magnetic field.

US 2015/0061680 A1 (=reference [4]) describes magnet arrangements and methods for generating magnetic fields. It encompasses magnet arrangements having a plurality of polyhedral magnets which are arranged in a lattice configuration and at least partly enclose a testing volume, wherein the magnet arrangement has an associated magnetic field with a designated field direction. The magnetization direction of the individual polyhedral magnets and the arrangement thereof are such that the resulting magnetic field approximates a Halbach sphere. In other words, arrangements are described in which the magnetization directions correspond to those of the three-dimensional Halbach design. Cylindrical rings are not mentioned, however; only the polyhedral magnet segments are joined together. Moreover, the field of the basic magnet according to the method described here is generally not homogeneous and is thus unsuitable for MR applications.

The simple Halbach design requires a large axial length and thus a large amount of magnet material in order to generate a field with sufficient homogeneity. Even a planar Halbach design having notches still requires an unnecessarily large amount of magnet material since the parts of the magnet that are axially far away have an unfavourable magnetization direction with regard to the field contribution thereof at the sample location.

US 2010/013473 A1 (=reference [2]) proposes an NMR permanent magnet having a Halbach architecture composed of three rings, with a central magnet ring being flanked by two head rings. The rings are mutually displaceable in a longitudinal direction with screws or threaded nuts for the purpose of field homogenization. US 2010/013473 A1 furthermore discloses the fact that the rings consist of individual segments that are alternately trapezoidal and rectangular, wherein the individual segments are displaceable in a radial direction for the purpose of field homogenization. This magnet has 64 mechanical degrees of freedom. Setting them is in any case rather complex. The magnetization of the individual segments only ever varies in the azimuthal direction and has no angle component pointing out of the plane of the respective magnet rings.

U.S. Pat. No. 10,018,694 B2 (=reference [1]), cited in the introduction, proposes a magnetic resonance apparatus with a permanent magnet system. Cuboidal magnets are arranged annular on the housing of the magnetic resonance apparatus to generate a homogeneous magnetic field in a measuring volume. The Halbach-like orientation of the magnetizations with respect to the measuring volume is achieved by an alternating orientation of the respective magnets in the housing. The cuboid magnets are uniformly magnetized with respect to their surfaces. This magnetic resonance apparatus has the disadvantage that it is expensive to create, since the expression of the holding receptacles in the housing for the individual magnets must be very precise for orientation according to the Halbach-condition. In addition, a low efficiency is achieved with respect to the achievable magnetic field strength by the spatial distance of the magnets to the measuring volume. Due to the cuboid shape of the individual magnets, a compact design is also not possible.

SUMMARY

Against that background, it is an object of the present invention to provide, using simple technical measures and with no increase in volume, a maximally compact and lightweight permanent magnet arrangement of the type defined in the introduction for an MR apparatus which—for a predefined field strength—has, at least in most regions of the magnet, a magnetization direction that is advantageous with regard to its field contribution at the sample location, and which simultaneously produces there a region having a particularly homogeneous field distribution and—particularly for high field strengths—a lowest possible leakage field.

This object is achieved by the present invention, in a manner that is just as surprisingly simple as it is effective, by virtue of (i) the ring-shaped magnet elements being constructed from magnet segments arranged next to one another and being composed of magnetic material, and (ii) the magnetization direction of the magnet segments with respect to their outer surfaces parallel to the respective ring plane being different in each case from that of the two magnet segments adjacent in the ring-shaped magnet element.

The invention includes arrangements of three-dimensional Halbach rings with the aim of generating a magnetic field that is homogeneous to the greatest possible extent in a predefined sample volume with as little material as possible being used. A three-dimensional (3D) Halbach ring arises from a traditional planar Halbach ring by rotating the magnetization vectors about the direction of the azimuthal vector by a 3D angle $\alpha$, a parameter fixed for the entire magnet ring. These rings are arranged such that the magnetization directions are oriented advantageously for amplifying the main field almost in the entire magnet system. Only in small regions near the sample are larger deviations from this advantageous orientation of the magnetization permitted, in order to improve the homogeneity of the field in the sample volume.

A central advantage of the arrangements of three-dimensional Halbach rings according to the invention is that the magnetic field strength is higher in comparison with planar Halbach rings, with the same amount of material being used. If consideration is given to a planar Halbach magnet extended infinitely in an axial direction, for example, then a magnetic field B0 of $Br*\log(r_a/r_i)$ results, wherein Br is the remanence of the magnet material, $r_a$ is the external radius and $r_i$ is the internal radius of the magnet ring, and a B0 of $4/3*Br*\log(r_a/r_i)$ results for the optimized 3D Halbach ($\alpha$=2*polar angle−$\pi$), wherein the polar angle is the angle between the spatial vector of the magnet element respectively considered and the hole axis. The 3D Halbach is thus stronger than the planar Halbach potentially by a factor of 4/3, with the same amount of material being used.

A permanent magnet system according to the present invention comprises two or more three-dimensional Halbach rings having a common axis. In this case, a three-dimensional Halbach ring is a ring composed of hard-magnetic material having a rectangular cross section.

The dimensions of the rings, their relative positions with respect to one another and their 3D angles are chosen such that the on-axis (zonal) field orders vanish up to a predefined order, the "design order", and at the same time the value of the central field is maximized. The off-axis (tesseral) field orders then likewise vanish up to the predefined order.

In the case of Halbach rings (irrespective of whether planar or 3D Halbach), only zonal and doubly periodic (tesseral) field orders occur, in principle. Furthermore, there is a proportional relationship between the zonal (=on-axis) and doubly periodic, i.e. tesseral (=off-axis), terms of identical order n, wherein the proportionality factor is dependent on n. An arrangement of Halbach rings configured such that a specific zonal term vanishes thus also has no tesseral terms of this order. Both properties (in principle only doubly periodic terms and proportional relationship between zonal and doubly periodic terms) were derived from Maxwell's equations for planar Halbach rings and were checked for 3D Halbach rings, which was not generally known previously.

The remaining inhomogeneities having orders less than or equal to the design order are then attributable to mechanical tolerances and material inhomogeneities and can be corrected using known shim technologies.

Each three-dimensional Halbach ring consists of uniform permanent magnet material. The material of different rings can be different here.

Preferred Embodiments and Developments of the Invention

Particular preference is given to a class of embodiments of the magnet arrangement according to the invention in which the magnet segments are constructed such that the magnetization direction of the individual magnet segments follows the formula $$Mr=M\,\mathrm{Cos}[\alpha]\mathrm{Cos}[\phi 0], M\phi=M\,\mathrm{Sin}[\phi 0], Mz=M\,\mathrm{Cos}[\phi 0]\,\mathrm{Sin}[\alpha],$$

wherein the components of the magnetization vector in cylindrical coordinates denote:

M the remanence of the magnet material used in the respective magnet ring, $\phi 0$ the azimuthal angle of the segment midpoint, and $\alpha$ a parameter fixed for the entire magnet ring, namely the 3D angle that determines the deviation of the magnetization directions from those of a planar Halbach ring.

Given a suitable choice of the ring dimensions, the ring positions and the 3D angles, an approximation to a 3D Halbach arrangement as in reference [3] results, but with a transverse hole, that is to say a hole perpendicular to the field direction. This arrangement is more effective than a longitudinally drilled 3D Halbach having a hole in the field direction, that is to say generates more field with the same amount of magnet material being used.

Further advantageous embodiments are characterized in that the magnet segments are produced from a hard-magnetic material having a high remanence M, wherein 1.5 T>M>0.7 T, and having a low permeability $\mu$ in the range of $1.0<\mu<1.5$, in particular from NdFeB. Thus, it is possible to achieve high field strengths in conjunction with low weight and reciprocal influencing of the magnet parts remains low.

A further advantageous embodiment provides for the magnet segments arranged in a region of high field strengths to be produced from a high-coercivity material having a coercivity HcJ in the range of 2800 kA/m>HcJ>1500 kA/m. The risk of partial demagnetization is significantly reduced as a result.

One preferred embodiment of the invention is characterized in that the magnet segments are produced from a temperature-compensated permanent magnet material having a temperature coefficient Tk in the range of 0%/K>Tk>−0.05%/K, in particular from SmCo. In this way, the magnet becomes more thermostable and the effort required for temperature regulation decreases.

A class of particularly preferred embodiments of the magnet arrangement according to the invention is distinguished by the fact that besides the mirror-symmetrical 3D Halbach rings, one or more of the ring-shaped magnet elements is/are constructed as a planar Halbach ring where $\alpha=0$. The additional planar Halbach rings serve principally to amplify the B0 field further. Preferably, this is a central ring surrounded by two mirror-symmetrical 3D Halbach rings. What is primarily advantageous is that no interfaces occur in the central region near the sample, said interfaces always being associated with inaccuracies and thus with disturbances of the homogeneity. However, it is also conceivable for the 3D Halbach rings to be flanked by planar Halbach rings where $\alpha=0$.

In a class of supplementary or alternative embodiments, besides the mirror-symmetrical 3D Halbach rings, one or more of the ring-shaped magnet elements is/are constructed as a laterally homogeneously magnetized ring where $\alpha=\pi$. A laterally homogeneously magnetized ring can be constructed from segments like an arbitrary three-dimensional Halbach ring. Owing to the uniform magnetization direction, however, there is also the possibility of manufacturing said ring from a continuous tube that is subsequently magnetized in one piece. These laterally homogeneously magnetized rings where $\alpha=\pi$ are preferably arranged in regions near the hole, that is to say in inner areas concentrically.

In both classes of embodiments, the arrangement can be produced particularly simply, fewer mutually different types of segments exist and a higher symmetry thus also results.

Also particularly advantageous are embodiments of the invention which are distinguished by the fact that the ring-shaped magnet elements are constructed such that far field coefficients of low order $n\leq 6$, in particular the dipole moment, vanish. The leakage field of the magnet arrangement can thus be considerably reduced during operation.

Also well proven in practice are embodiments which are characterized in that the ring-shaped magnet elements are arranged concentrically around the z-axis, and in that the radially inner ring-shaped magnet element has a higher coercive field strength than the radially outer ring-shaped magnet elements. This is expedient particularly if there are more than two rings present which are constructed concentrically in pairs and the magnet pair rings are arranged coaxially with respect to one another. The risk of partial demagnetization is reduced as a result.

In embodiments which are particularly simple and inexpensive to produce, the magnet segments of each annular magnet element have the same outer shape.

For geometrical reasons, embodiments of the invention are advantageous in which magnet segments of each ring-shaped magnet element have the shape of a trapezoidal prism. Such trapezoidal prisms are particularly easy to assemble into a roughly hollow cylindrical annulus.

Particularly high magnetic field strengths or a particular compactness of the arrangement can be achieved with embodiments in which the magnet segments of each ring-shaped magnet element are arranged directly adjacent to each other in the assembled state.

Within each ring-shaped magnet element, the magnet segments consist of uniform permanent magnet material. The magnet segments are preferably directly adjacent within the ring-shaped magnet elements, in particular, the gaps between the magnet segments are substantially smaller than the outer dimensions of the magnet segments. To stabilize the ring-shaped magnet elements, the gaps are advantageously filled with an adhesive.

In addition, the magnet segments are advantageously disposed within the magnetic elements symmetrically with respect to the z-axis, i.e. a rotation of the ring-shaped magnet element by the angular range of a magnet segment with respect to the z-axis converts the structure but not necessarily the magnetization direction of the ring-shaped magnet element itself. Furthermore, the direction of magnetization of adjacent magnet segments in the ring-shaped magnet elements also varies with respect to the outer shape of the magnet segments. Prior to assembling of the magnet segments into ring-shaped magnet elements, adjacent magnet segments must be individually magnetized in a different direction with respect to their outer shape, wherein the direction being chosen is in compliance with the 3D angle $\alpha$ and the Halbach-angle.

Magnetic materials often have a preferred axis along which a magnetization can be particularly effective. Therefore, it is advantageous if the individual magnet segments are individually formed from the magnetic material such that this preferred axis extends in the direction of the magnetization direction to be taken for the arrangement in the ring-shaped magnet element.

In general, the ring-shaped magnet elements will be arranged in a manner stacked one above another in the z-direction, wherein the permanent magnet system has at least two ring-shaped magnet elements and the ring-shaped magnet elements are fixedly adhesively bonded as a whole and are displaceable laterally relative to one another as a whole. This arrangement enables the individual ring assemblies (optionally composed of different materials) to be mounted as self-contained assemblies in contrast to the Halbach sphere in accordance with reference [3].

Particular preference is given to an embodiment of the magnet arrangement according to the invention in which the ring-shaped magnet elements are mounted rotatably about the z-axis. Production-dictated fluctuations of the segments combined in a ring-shaped fashion may bring about an angular deviation of the magnetic axis of an entire ring. The embodiment described makes it possible to correct this angular deviation by setting a corresponding angle in the opposite sense.

Particular preference is given to embodiments of the invention which comprise a device for homogenizing the magnetic field, preferably a shim tube, for shimming the higher field orders. In this way, the mechanisms described beforehand are supplemented by a further, even more precise instrument for homogenization. Corrections with even finer resolution are thus possible.

Using passive shim elements, the homogeneity in the interior of the magnet hole, in particular in a shim tube, can be significantly improved. Moreover, an improvement in the homogeneity can also be achieved with electrical shim coils in the interior of the hole.

The scope of the present invention also encompasses a method for producing a magnet arrangement in accordance with the above-described embodiments or the developments thereof, comprising:

a) predefining a target magnetic field B0 and the required number of magnet rings composed of known magnet material and a desired internal diameter of the central hole;

b) determining the desired homogeneity and leakage field properties by equating to zero at least one field order of the central or far field expansion;

c) determining the free design parameters, namely geometry parameters of the rings and 3D angles $\alpha$ of the rings, by optimizing the magnet volume under the constraints from steps a) and b);

d) determining the desired weight as a function of the design parameters determined under step c).

In one advantageous variant of the method according to the invention, in step c) the field orders and the magnet volume are calculated directly from the design parameters by way of analytical formulae. In this way, the optimization calculation proceeds particularly rapidly and extensive parameter studies are made possible.

In a further preferred method variant, the individual magnet segments are produced in the defined magnetization direction in a manner complying with the 3D angle $\alpha$ and the Halbach angle before they are assembled to form magnet rings. The segments have the predefined dimensions such as are predefined in step a) and were determined in steps c) and d). The number of segments per ring is preferably between 8 and 32, particularly preferably from 16 to 24. The number of segments per ring is crucial for the off-axis homogeneity. Moreover, a higher number of segments brings about a greater approximation to the design field strength.

Further advantages of the invention are evident from the description and the drawing. Likewise, the features mentioned above and those that will be explained further can be used according to the invention in each case individually by themselves or as a plurality in arbitrary combinations. The embodiments shown and described should not be understood as an exhaustive enumeration, but rather are of exemplary character for outlining the invention.

BRIEF DESCRIPTION OF THE DRAWINGS

The invention is illustrated in the figures and diagrams of the drawings section and is explained in greater detail on the basis of exemplary embodiments.

In the figures.

DETAILED DESCRIPTION

Figure 1A:
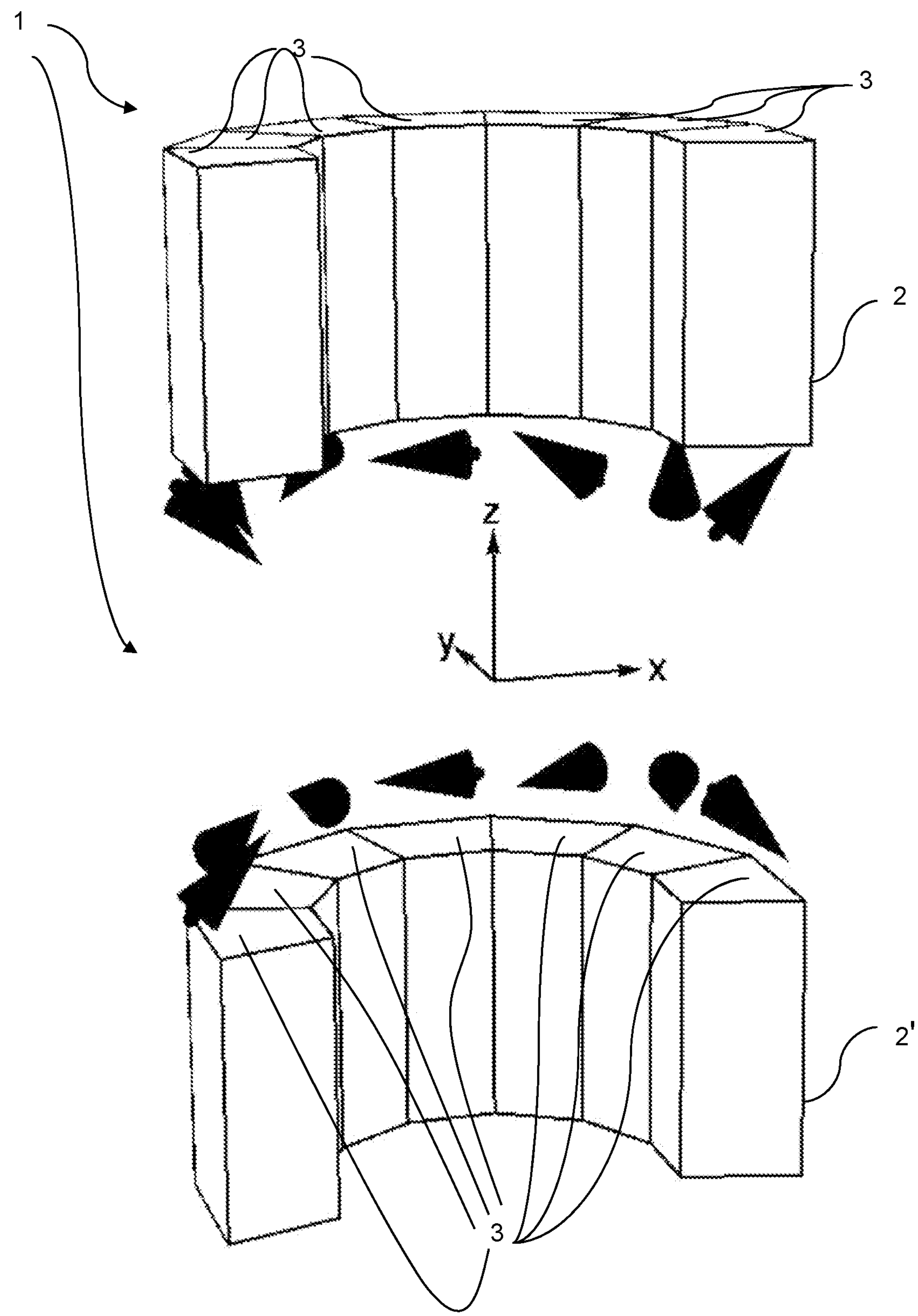
FIG. 1A shows a schematic spatial vertical sectional half-illustration of a simple embodiment of the magnet arrangement according to the invention having two ring-shaped magnet elements arranged mirror-symmetrically with respect to the xy-plane, and having 3D Halbach magnetization of the individual magnet segments that is indicated by arrows in each case.

The magnet arrangement 1 according to the invention such as is illustrated in each case schematically in various embodiments in the drawing finds its main application as part of a magnetic resonance apparatus—not shown specifically in the drawing—having a permanent magnet system for generating a homogeneous magnetic field in the direction of a z-axis in a measurement volume 0 (indicated in FIG. 3B), wherein the permanent magnet system comprises at least two ring-shaped magnet elements 2, 2' composed of magnetic material in a ring plane, which are arranged coaxially around the z-axis and are constructed from individual magnet segments 3 arranged next to one another in a Halbach configuration.

Figure 3A:
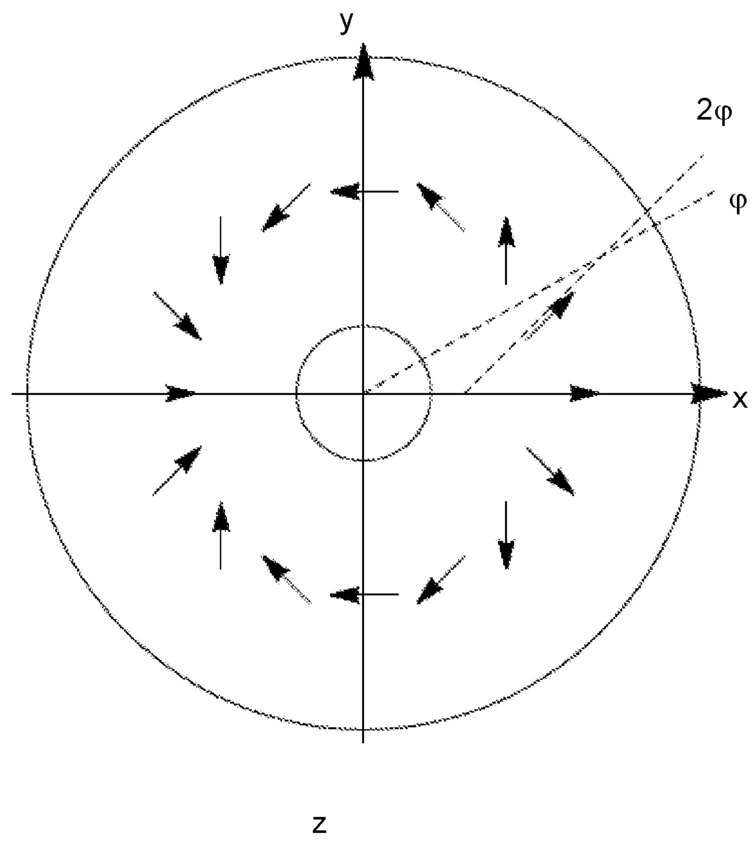
FIG. 3A shows a schematic sectional illustration through a ring plane of a magnet arrangement having a flat 2D Halbach configuration of the local magnetization directions according to the prior art.
Figure 3B:
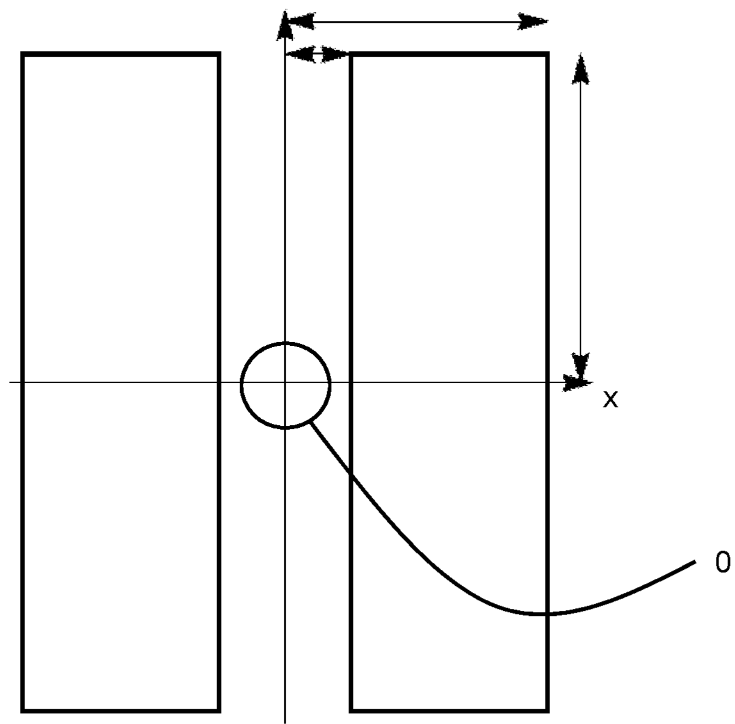
FIG. 3B shows the magnet arrangement according to the prior art from FIG. 3A in a schematic vertical sectional view.

A "traditional" Halbach configuration such as has also already been described in the prior art is illustrated schematically in FIGS. 3A and 3B:

FIG. 3A shows a sectional view through a ring plane of such a magnet arrangement having a flat (2D) Halbach configuration of the local magnetization directions of in each case 2 $\phi$ at a location with azimuthal angle f.

FIG. 3B shows the magnet arrangement from FIG. 3A in a schematic vertical sectional view.

The present invention indeed likewise relates to a magnet ring system composed of a plurality of rings in a Halbach configuration, but the outer rings comprise, in the magnetization direction, a spatial component (3D) pointing out of the ring plane. As an essential useful effect, this arrangement makes possible a more compact design of the magnet for higher field strength and also a lower leakage field.

Figure 1B:
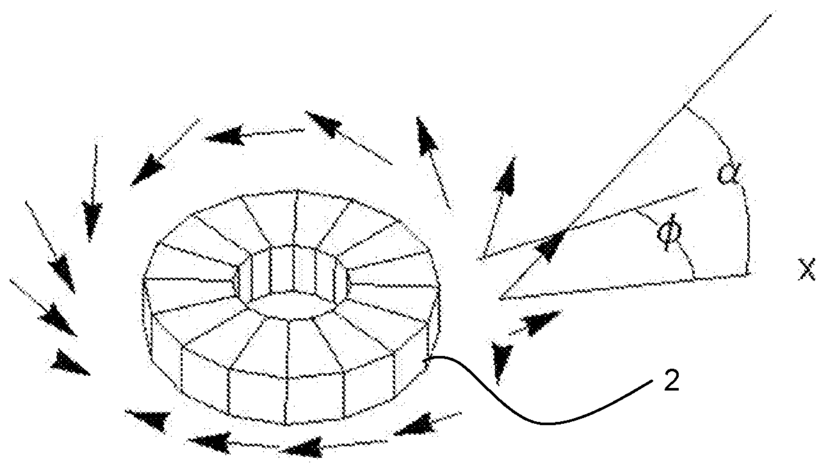
FIG. 1B shows a schematic spatial illustration of a complete ring-shaped magnet element according to the invention with depicted azimuthal angle $\phi$ and 3D angle $\alpha$.

Generally, the magnet arrangement 1 according to the present invention—as is shown illustratively in FIGS. 1A and 1B is distinguished by the fact that the magnetization direction of at least two ring-shaped magnet elements 2, 2' deviates from the ring plane in such a way that the component perpendicular to the ring plane varies cosinusoidally with the azimuthal angle of the respective ring-shaped magnet element 2, 2', wherein a 3D angle $\alpha$ determines the deviation of the magnetization directions from those of a planar (2D) Halbach ring, and that the magnetization of in each case two ring-shaped magnet elements 2, 2' is mirror-symmetrical with respect to one another, wherein the mirror plane is the central x-y-plane perpendicular to the z-axis. In FIG. 1B, the 3D angle $\alpha$ is depicted as the angle between the x-axis and the magnetization direction of that segment which is positioned in the x-direction.

Figure 2A:
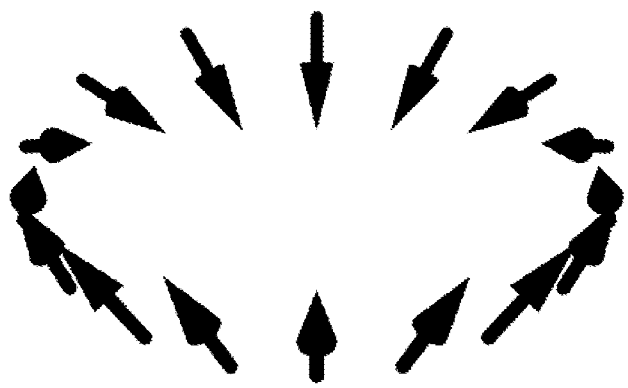
FIG. 2A shows a schematic spatial illustration of the spatial 3D Halbach configuration according to the invention, visualized with arrows for the respective magnetization direction.

A 3-dimensional distribution of the magnetization directions in a 3D Halbach ring, in the case of which distribution the magnetization vectors partly project from the ring plane according to the invention, is illustrated in FIG. 2A.

Figure 2B:
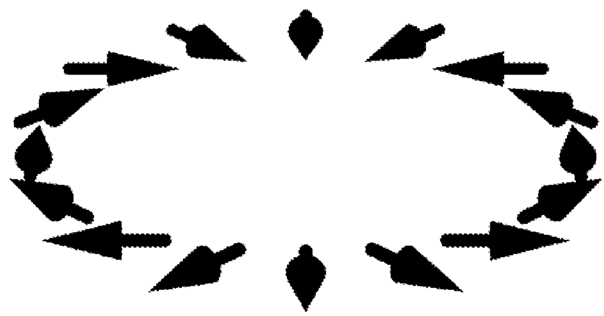
FIG. 2B shows the spatial illustration of FIG. 2A, but with a flat 2D Halbach configuration in a ring plane according to the prior art.

For comparison, FIG. 2B shows the distribution of magnetization directions in a "traditional" 2D Halbach ring according to the prior art, in the case of which distribution the magnetization vectors always lie within the ring plane.

Preferably, the magnet segments 3 are constructed in the magnet arrangement according to the invention such that the magnetization direction of the individual magnet segments 3 follows the formula $$Mr=M\,\mathrm{Cos}[\alpha]\mathrm{Cos}[\phi 0],\quad M\phi=M\,\mathrm{Sin}[\phi 0],\quad Mz=M\,\mathrm{Cos}[\phi 0]\mathrm{Sin}[\alpha],$$

wherein the components of the magnetization vector in cylindrical coordinates denote:

M the remanence of the magnet material used in the respective ring-shaped magnet element 2, 2', $\phi 0$ the azimuthal angle of the segment midpoint, and $\alpha$ a parameter fixed for the entire ring-shaped magnet element 2, 2', namely the 3D angle that determines the deviation of the magnetization directions from those of a planar Halbach ring.

Figure 5:
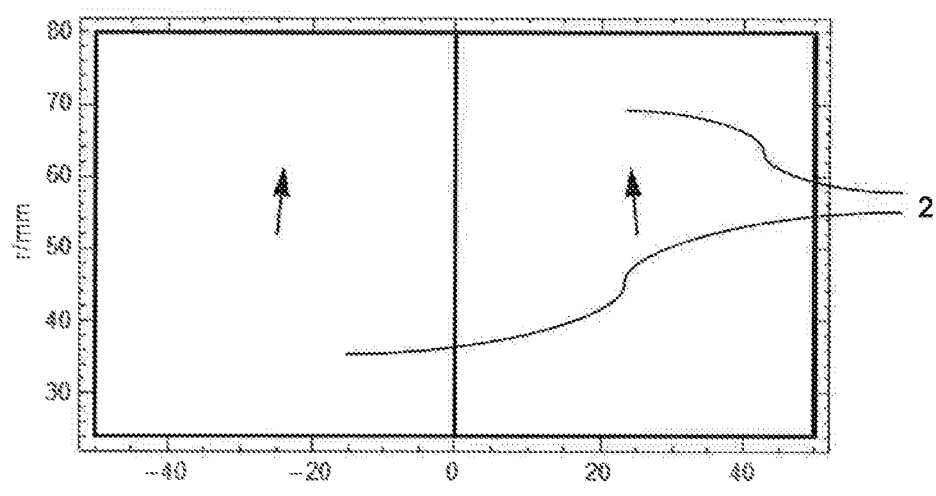
FIG. 5 shows a schematic vertical sectional view through a simple embodiment of the invention having two 3D Halbach rings in a mirror-symmetrical arrangement (=exemplary embodiment 1)

FIG. 5 shows a first, particularly simple exemplary embodiment:

Example 1

The determination of an optimized geometry of a Halbach magnet according to the invention here comprises just two ring-shaped magnet elements 2, 2' arranged mirror-symmetrically and having mirror-symmetrical magnetization. For illustrating the design process according to the invention, the simplest possible case shall be considered: two three-dimensional Halbach rings 2 and 2' comprising identical magnet material are situated symmetrically with respect to the origin plane. The inner hole shall be fixedly predefined.

The (half) magnet length, the external radius and the (likewise symmetrical) 3D angle $\alpha$ then remain as free design variables. If a specific target field B0 (in the example, B0=Br=1.4 T was chosen given a hole having a radius of 24 mm) and homogeneity of the lowest order (vanishing second field order B2=0) are demanded, then the degrees of freedom decrease to 1.

Figure 4A:
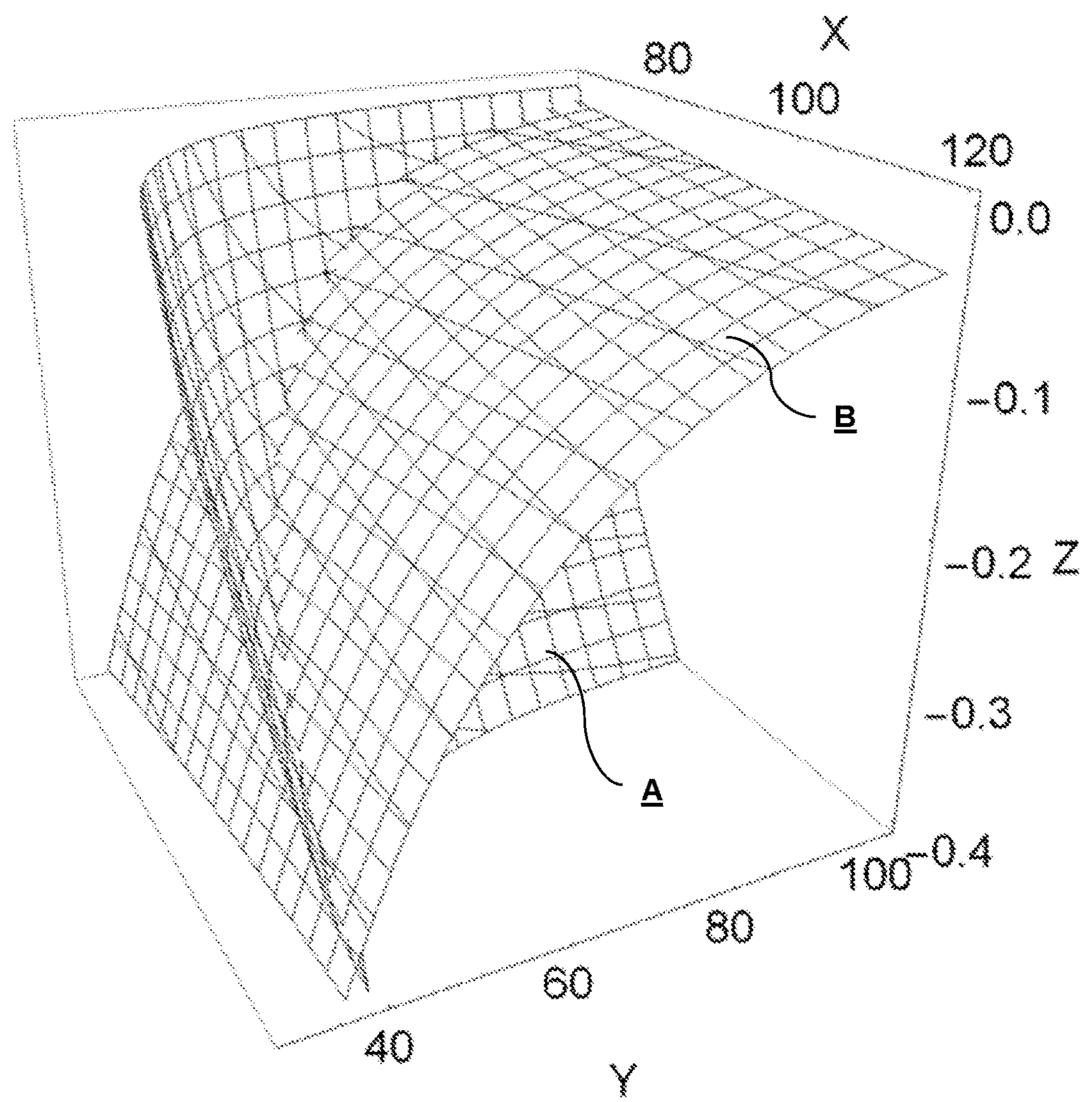
FIG. 4A shows a spatial diagram of the relationship of the design variables "external radius", "3D angle" and "half length" for the optimized design of a magnet arrangement according to the invention.

This is illustrated in the graph in FIG. 4A: the first area A shows all combinations of the design variables for which the target field B0 is attained; the second area B shows all combinations for which the second field order B2 vanishes. The external radius of the Halbach ring in [mm] is plotted on the X-axis. Y denotes the half length of the magnet in [mm]. The 3D angle is indicated in radians on the Z-axis.

That curve on which both demands are met results as a line of intersection. That point on the line which minimizes the total weight of the magnet is now sought for defining the current design.

Figure 4B:
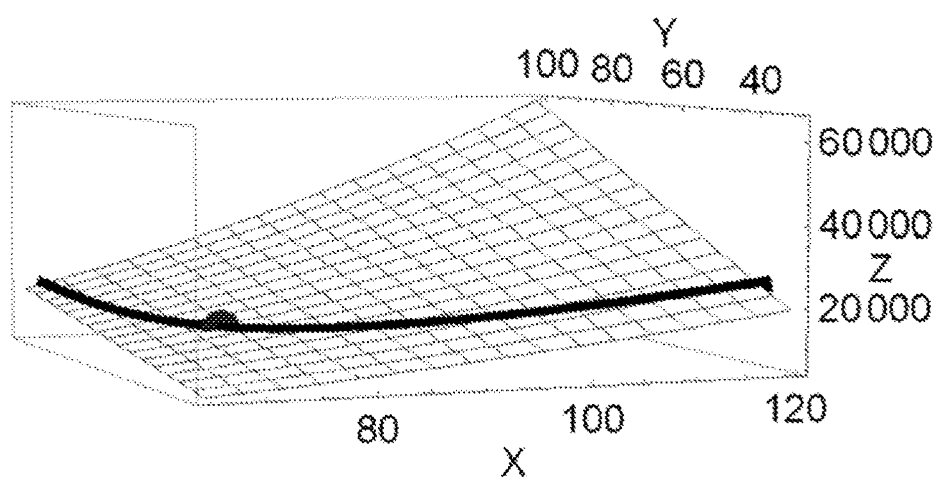
FIG. 4B shows a spatial diagram of the function of the parameter "weight" as a function of the design variables "external radius" and "half length" for the optimized design of a magnet arrangement according to the invention.

The graph in FIG. 4B shows the weight of the magnet arrangement as a function of magnet length and external radius. The external radius of the Halbach ring in [mm] is plotted on the X-axis, Y once again denotes the half length of the magnet in [mm], and the resulting weight is indicated on the Z-axis. If the curve determined above is transferred to this graph, then it is evident that it rises towards the edges, while it assumes a minimum in the central region. This point corresponds to the design optimized in the sense of the invention.

Figure 6:
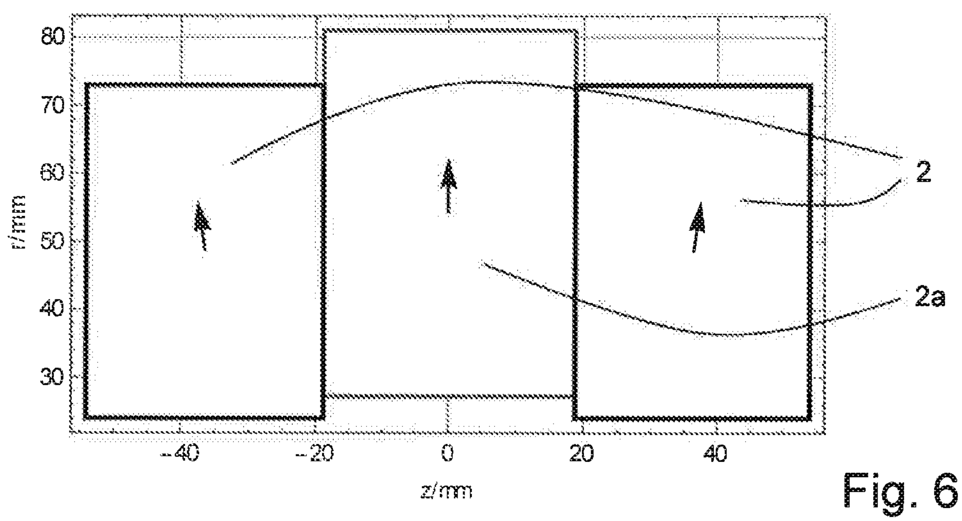
FIG. 6 shows a schematic vertical sectional view through a further embodiment of the invention having three Halbach rings, wherein the central ring has a 3D angle of $\alpha=0$, while the two outer rings are in a mirror-symmetrical arrangement with respect to one another (=exemplary embodiment 2)

FIG. 6 shows a further, still relatively simple exemplary embodiment:

Example 2

The permanent magnet in a Halbach configuration here comprises three rings with predefined remanence M=B0=1.4 T, wherein the central ring **2*a* has a 3D angle of $\alpha$=0. The two outer rings 2** are once again mirror-symmetrical with respect to one another in terms of the magnetization.

Figure 7:
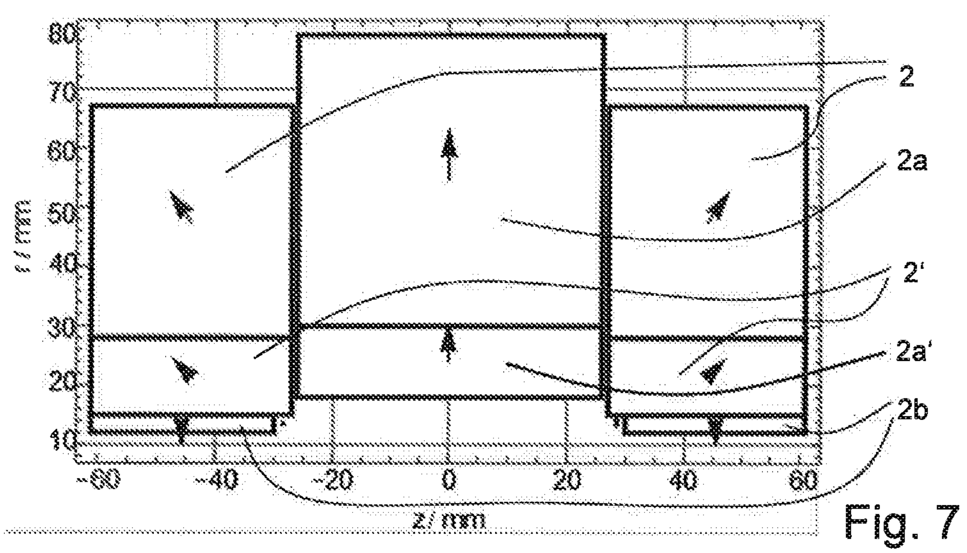
FIG. 7 shows an even more complex embodiment of the magnet arrangement according to the invention having eight magnet rings (=exemplary embodiment 3).

Essential Boundary Conditions for Exemplary Embodiment 2:

- B0=1.4 T (60 MHz), 48 mm hole
- second and fourth field orders vanish
- Br=1.4 T (NdFeB)
- weight 13 kg
- $\alpha$=0.15 in the outer rings, planar Halbach ring in the centre FIG. 7, finally, shows a somewhat more complex exemplary embodiment:

Example 3

The permanent magnet in a Halbach configuration here comprises eight rings with predefined remanence M=B0=1.9 T, wherein the central rings have a 3D angle of $\alpha$=0. The laterally outer rings 2, 2' are mirror-symmetrical with respect to one another in pairs in each case in the magnetization direction. The both radially outermost and laterally central ring **2*a* having a 3D angle of $\alpha$=0 is adjoined radially inwardly by a further laterally central ring 2*a'* having a 3D angle of likewise $\alpha$=0. In this example, the flat, radially innermost ring-shaped magnet elements 2b adjoining the radially inner 3D Halbach rings 2'** from inner areas have a homogeneous magnetization with the 3D angle α=71 These rings supplement the total magnetic field and furthermore result in even greater homogeneity of the magnetic field generated.

Essential Boundary Conditions for Exemplary Embodiment 3:

B0=1.9 T (80 MHz), 24 mm hole
second, fourth and sixth field orders vanish
Br=1.4 T and 1.3 T, respectively, for radially inner rings (NdFeB)
weight 14 kg
α=0.62 and 0.80 in the axially outer rings 2 and 2', respectively, laterally homogeneously magnetized in the radially innermost rings 2b, planar Halbach rings 2a, 2a' axially in the centre It is clearly evident in Examples 2 and 3 that, with the configuration according to the invention of the magnet rings and an adapted 3D angle α in the magnetization direction, magnets having a high remanence of up to 1.9 T in conjunction with a very low weight (here: 14 kg) are producible. Comparable designs composed of "traditional" planar Halbach rings weigh 14 kg (Example 2) and 20 kg (Example 3). At the same time, the magnet in Example 3 is configured in such a way that magnetic field inhomogeneities up to the $6^{th}$ order vanish, and still up to the $4^{th}$ order in Example 2.

LIST OF REFERENCE SIGNS

0 Measurement volume
1 Magnet arrangement
2; 2' Ring-shaped magnet elements having 3D Halbach magnetization
2a; 2a' Ring-shaped magnet elements having 2D Halbach magnetization
2b Further ring-shaped magnet elements having 2D Halbach magnetization
3 Magnet segments
Physical Variables
x, y, z Cartesian coordinates
ϕ0 Azimuthal angle of the segment midpoint
α 3D angle
M Remanence
μ Permeability
HcJ Coercivity
Tk Temperature coefficients
n Order of the far field coefficients
B0 Target magnetic field
A First area
B Second area

LIST OF REFERENCES

Documents taken into consideration for the assessment of patentability

[1] U.S. Pat. No. 10,018,694 B2
[2] US 2010/013473 A1
[3] U.S. Pat. No. 4,837,542
[4] US 2015/0061680 A1

What is claimed is:

1. Method for producing a magnet arrangement, comprising:

a) predefining a target magnetic field B0 and a required number of ring-shaped magnet elements composed of known magnet material and a desired internal diameter of a central hole of the magnet arrangement;

b) determining a desired homogeneity and leakage field properties by equating to zero at least one field order of a central or far field expansion;

c) determining free design parameters, including geometry parameters of the ring-shaped magnet elements and 3D angles α of the ring-shaped magnet elements, by optimizing a volume of the magnet arrangement in accordance with said steps a) and b);

d) determining a desired weight of the magnet arrangement as a function of the design parameters determined in accordance with said step c); and e) producing individual magnet segments with defined magnetization directions in a manner complying with the 3D angles α and an associated Halbach angle before the magnet segments are assembled.

2. Method according to claim 1, wherein in said step c), calculating the field orders and the magnet volume directly from the design parameters by way of analytical formulae.

3. Method according to claim 1, further comprising assembling the individual magnet segments to form the ring-shaped magnet elements.

4. Magnet arrangement in a magnetic resonance apparatus comprising:

a permanent magnet system configured to generate a homogeneous magnetic field in a direction perpendicular to a z-axis in a measurement volume (0), wherein the permanent magnet system comprises at least two ring-shaped magnet elements containing magnetic material in a ring plane, which are arranged coaxially around the z-axis and which are constructed from individual magnet segments composed of magnetic material and arranged next to one another in a Halbach configuration, wherein magnetization directions of the at least two ring-shaped magnet elements deviate from the ring plane such that respective magnetization vector components perpendicular to the ring plane vary with azimuthal angle of the respective ring-shaped magnet elements, wherein a three-dimensional (3D) angle α determines deviations of the magnetization directions from analogous magnetization directions of a planar Halbach ring, and wherein the respective magnetization directions of each of the at least two ring-shaped magnet elements are mirror-symmetrical with respect to one another in relation to a mirror plane, wherein the mirror plane is a central x-y-plane perpendicular to the z-axis, and wherein magnetization directions of the magnet segments with respect to their outer surfaces parallel to the ring plane differ respectively from those of two adjacent ones of the magnet segments in the ring-shaped magnet element.

5. Magnet arrangement according to claim 4, wherein the magnet segments are constructed such that the magnetization directions of the individual magnet segments are defined by:

$$Mr=M\,\mathrm{Cos}[\alpha]\mathrm{Cos}[\phi 0],\ M\phi=M\,\mathrm{Sin}[\phi 0],\ Mz=M\,\mathrm{Cos}[\phi 0]\,\mathrm{Sin}[\alpha],$$

wherein the respective magnetization vector components are given in cylindrical coordinates r, ϕ, z and denote:

M a remanence of the magnet material used in the respective ring-shaped magnet element, ϕ(0) an azimuthal angle of a segment midpoint in the measurement volume (0), and $\alpha$ a parameter fixed for the ring-shaped magnet element in its entirety, namely the 3D angle that determines the deviations of the magnetization directions from the analogous magnetization directions of a planar Halbach ring.

6. Magnet arrangement according to claim 4, wherein the magnet segments are produced from a hard-magnetic material having a high remanence M, wherein 1.5 T >M >0.7 T, and having a low permeability $\mu$ in the range of $1.0<\mu<1.5$.

7. Magnet arrangement according to claim 6, wherein the magnet segments are produced from NdFeB.

8. Magnet arrangement according to claim 4, wherein the magnet segments arranged in a region of high field strengths are produced from a high-coercivity material having a coercivity HcJ in the range of 2800 kA/m >HcJ >1500 kA/m.

9. Magnet arrangement according to claim 4, wherein the magnet segments are produced from a temperature-compensated permanent magnet material having a temperature coefficient Tk in the range of 0%/K >Tk >−0.05%/K.

10. Magnet arrangement according to claim 8, wherein the magnet segments are produced from SmCo.

11. Magnet arrangement according to claim 4, further comprising at least one further ring-shaped magnet element as a planar Halbach ring, where $\alpha=0$, arranged coaxially with respect to the at least two ring-shaped magnet elements, which are arranged coaxially around the z-axis.

12. Magnet arrangement according to claim 4, further comprising at least one further ring-shaped magnet element as a laterally homogeneously magnetized ring, where $\alpha=\pi$, arranged coaxially with respect to the at least two ring-shaped magnet elements, which are arranged coaxially around the z-axis.

13. Magnet arrangement according to claim 4, wherein the ring-shaped magnet elements are constructed such that far field coefficients of low order $n\leq 6$ vanish.

14. Magnet arrangement according to claim 13, wherein the ring-shaped magnet elements are constructed such that a dipole moment of the permanent magnet system vanishes.

15. Magnet arrangement according to claim 4, wherein the ring-shaped magnet elements are arranged concentrically around the z-axis, and a radially inner one of the ring-shaped magnet elements has a higher coercive field strength than do radially outer ones of the ring-shaped magnet elements.

16. Magnet arrangement according to claim 4, wherein the magnet segments of each ring-shaped magnet element have one same outer shape.

17. Magnet arrangement according to claim 4, wherein the magnet segments of each ring-shaped magnet element have a trapezoidal prism shape.

18. Magnet arrangement according to claim 4, wherein the magnet segments of each ring-shaped magnetic element are arranged directly adjacent to each other in an assembled state of the magnet arrangement.

19. Magnet arrangement in a magnetic resonance apparatus comprising:

a permanent magnet system configured to generate a homogeneous magnetic field in a direction perpendicular to a z-axis in a measurement volume (0), wherein the permanent magnet system comprises at least two ring-shaped magnet elements containing magnetic material in a ring plane, which are arranged coaxially around the z-axis and which are constructed from individual magnet segments composed of magnetic material and arranged next to one another in a Halbach configuration, wherein magnetization directions of the at least two ring-shaped magnet elements deviate from the ring plane such that respective magnetization vector components perpendicular to the ring plane vary with azimuthal angle of the respective ring-shaped magnet elements, wherein a three-dimensional (3D) angle $\alpha$ determines deviations of the magnetization directions from analogous magnetization directions of a planar Halbach ring, and wherein respective magnetization directions of each of the at least two ring-shaped magnet elements are mirror-symmetrical in a mirror plane with respect to one another in relation to a mirror plane, wherein the mirror plane is a central x-y-plane perpendicular to the z-axis, wherein magnetization directions of the magnet segments with respect to their outer surfaces parallel to the ring plane differ respectively from those of two adjacent ones of the magnet segments in the ring-shaped magnet element, and wherein the magnet segments of each of the at least two ring-shaped magnetic elements are arranged directly adjacent to each other in an assembled state and the magnet segments are constructed such that the magnetization directions of the individual magnet segments are defined by $$Mr=M\,\mathrm{Cos}[\alpha]\mathrm{Cos}[\phi 0], M\phi=M\,\mathrm{Sin}[\phi 0], Mz=M\,\mathrm{Cos}[\phi 0]\,\mathrm{Sin}[\alpha],$$

wherein the respective magnetization vector components are given in cylindrical coordinates r, $\phi$, z, and denote:

M a remanence of the magnet material used in the respective ring-shaped magnet element, $\phi(0)$ an azimuthal angle of a segment midpoint in a measurement volume (0), and $\alpha$ a parameter fixed for the ring-shaped magnet element in its entirety, namely the 3D angle that determines the deviations of the magnetization directions from the analogous magnetization directions of a planar Halbach ring.

* * * * *

UNITED STATES PATENT AND TRADEMARK OFFICE

CERTIFICATE OF CORRECTION

PATENT NO. : 11,193,998 B2
APPLICATION NO. : 16/547769
DATED : December 7, 2021
INVENTOR(S) : Niemann et al.

It is certified that error appears in the above-identified patent and that said Letters Patent is hereby corrected as shown below:

On the Title Page

Item [73], delete “BROKER BIOSPIN GMBH,” and insert --BRUKER BIOSPIN GMBH,-- therefor.

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*